United States Patent [19]

Ridoux et al.

[11] Patent Number: 4,843,580
[45] Date of Patent: Jun. 27, 1989

[54] NOISE IMMUNE CRANKSHAFT PULSE POSITION DEVELOPING APPARATUS

[75] Inventors: Frank E. Ridoux, Kokomo; Michael A. Neuhalfen, Galveston, both of Ind.

[73] Assignee: Delco Electronics Corporation, Kokomo, Ind.

[21] Appl. No.: 65,956

[22] Filed: Jun. 24, 1987

[51] Int. Cl.$^4$ .............................................. H03K 5/13
[52] U.S. Cl. .................................. 364/569; 324/160; 364/572
[58] Field of Search ........... 364/569, 565, 572, 431.04, 364/431.03; 324/160, 166, 161–165, 173, 176; 123/414; 377/30

[56] References Cited

U.S. PATENT DOCUMENTS

| | | |
|---|---|---|
| 3,386,079 | 5/1968 | Wiggins . |
| 3,938,082 | 2/1976 | Schowe, Jr. . |
| 4,323,976 | 4/1982 | Radaelli et al. .................... 364/565 |
| 4,382,293 | 5/1983 | Evans ...................................... 371/6 |
| 4,456,992 | 6/1984 | Schaub ..................................... 371/6 |
| 4,532,592 | 7/1985 | Citron et al. .................... 364/431.05 |
| 4,538,235 | 8/1985 | Henning ............................... 364/569 |
| 4,553,426 | 11/1985 | Capurka ................................. 73/116 |
| 4,575,677 | 3/1986 | Dennis .................................. 324/161 |
| 4,578,755 | 3/1986 | Quinn et al. ...................... 364/431.01 |
| 4,686,483 | 8/1987 | Isshiki et al. ........................ 328/165 |
| 4,741,310 | 5/1988 | Yagi et al. ........................... 123/425 |

Primary Examiner—Parshotam S. Lall
Assistant Examiner—S. A. Melnick
Attorney, Agent, or Firm—C. R. Meland

[57] ABSTRACT

A digital system for providing pulses that represent the position of an engine crankshaft that has a digital filter for filtering out pulses caused by noise. A square wave signal having voltage pulses that represent crankshaft position is applied to the input of the filter. The filter determines whether or not the high and low time periods of the square wave signal exceed a predetermined time period and based on this determination ignores or passes pulses of the square wave to the output of the filter.

6 Claims, 2 Drawing Sheets

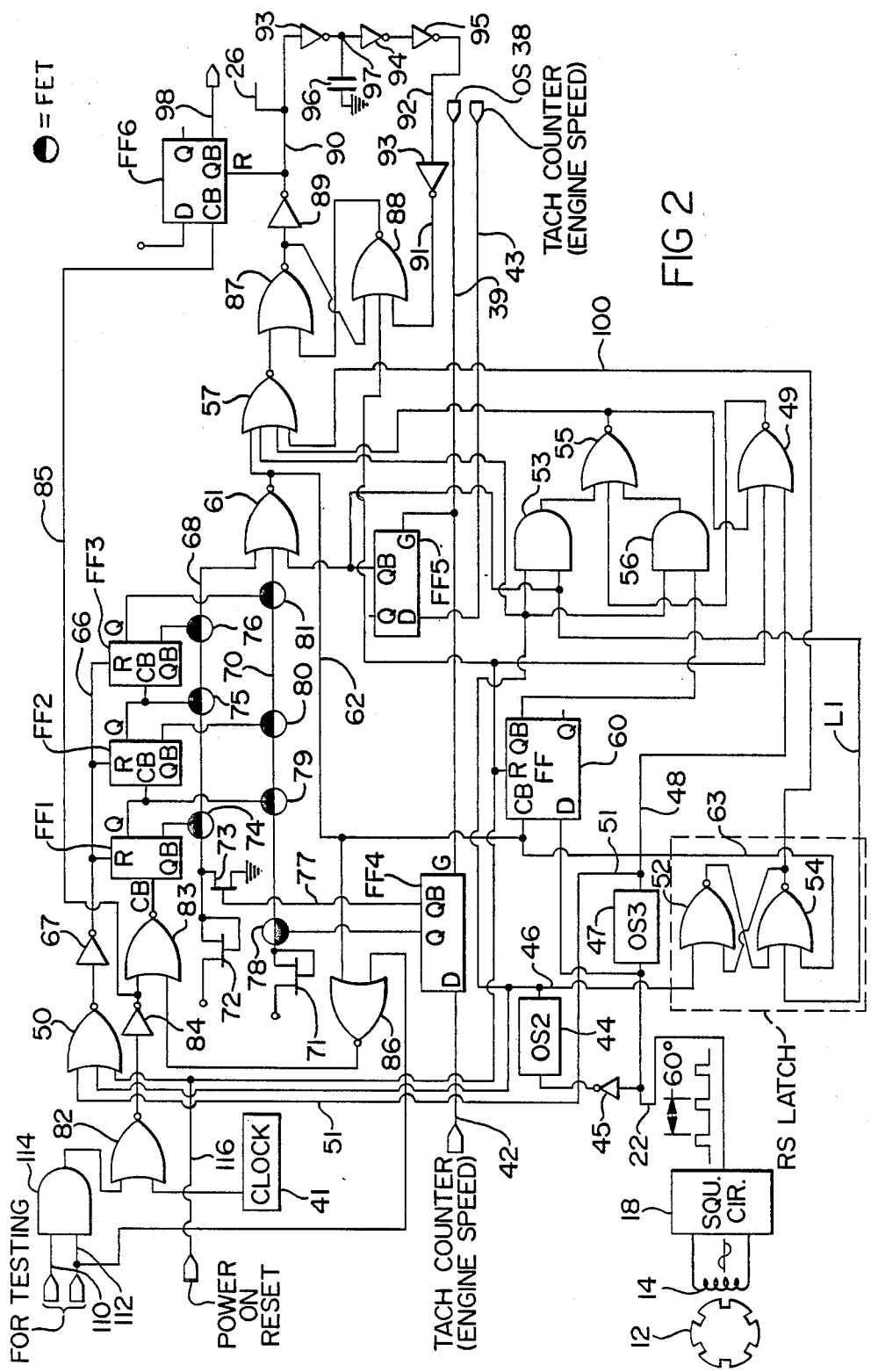

NOISE IMMUNE CRANKSHAFT PULSE POSITION DEVELOPING APPARATUS

This invention relates to a digital system for providing digital pulses at certain positions of an engine crankshaft and more particularly to a digital system that has a digital filter to provide noise immunity.

When a magnetic pickup is used to detect crankshaft or camshaft position the pickup coil may be subjected to magnetic fields that cause noise voltages to be developed. Thus, an unwanted voltage may be induced in the pickup coil which if processed will cause an error voltage to be developed. Where the voltage induced in the pickup coil controls the timing of an ignition system and where the ignition coil of the ignition system is located near the pickup coil the magnetic field developed by the coil may induce spurious signals. Further, the magnetic field developed by the ignition coil may cause noise problems in the digital electronics that responds to the voltage induced in the pickup coil and noise voltages can be developed in the digital electronics by various other noise sources.

It is an object of this invention to provide a digital pulse developing system that develops pulses at certain crankshaft positions which has a digital filter that is capable of ignoring voltage pulses that are caused by noise while passing valid pulses that are not caused by noise. In carrying this object forward the system of this invention monitors or measures time periods that correspond to the times that a digital signal is at a one or high level or at a zero or low level. The system determines whether valid one or valid zero levels have occurred by determining whether or not the time periods that the signal is high or low is longer than a predetermined time period. If the signal remains at a one level for longer than a predetermined period of time a valid one level is recognized or achieved. Likewise, if the signal remains at a low or zero level for longer than a predetermined period of time a valid zero level is recognized or achieved.

When the digital signal has been at a valid one level and then goes low the system will process this falling edge immediately. The now existing zero level must then be held for the predetermined length of time before any subsequent logical one states are recognized.

The digital filter is capable of filtering out noise induced positive glitches, that is noise induced voltage pulses that begin with a zero to one level transition. Thus, a one level occurring after a valid zero state has been recognized must remain at a one level for the predetermined length of time before it is considered a valid one state, otherwise it is completely ignored.

Another object of this invention is to provide a digital system of the type described wherein the predetermined time periods for determining valid one and valid zero levels are varied as a function of engine speed. The time periods are controlled such that they are decreased at a high range of engine speed as compared to the time periods used over a lower engine speed range.

IN THE DRAWINGS

FIG. 2 is a schematic circuit diagram of a digital filter which is shown as a block in FIG. 1.

Figure 1:
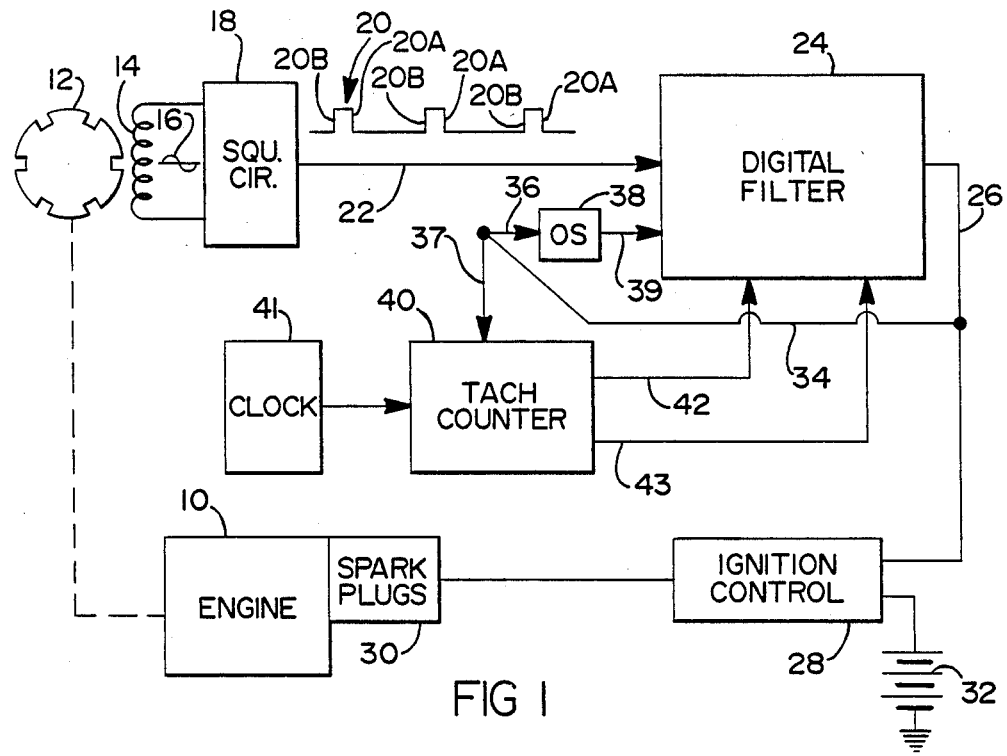
FIG. 1 illustrates an ignition system for an internal combustion engine that has a digital pulse developing system made in accordance with this invention.

Referring now to the drawings and more particularly to FIG. 1, an ignition system for an internal combustion engine is illustrated which utilizes the digital filter of this invention. In FIG. 1, the reference numeral 10 designates a spark-ignited internal combustion engine that has a crankshaft. The crankshaft drives a disk or wheel 12 which has six slots that are spaced by 60°. The disk 12 forms part of a magnetic or variable reluctance pickup that has a pickup coil 14. When a slot passes the pickup coil 14 an alternating voltage designated as 16 is induced in coil 14. These alternating voltages occur at every 60° of rotation of the crankshaft of the engine.

The alternating voltage 16 is applied to a squaring circuit 18 which has a zero crossing detector. The circuit 18 develops a square-wave voltage 20 that is applied to line 22. This square-wave voltage has a one level to zero level transistions 20A (falling edges) that are spaced by 60°. The line 22 is connected to a digital filter 24 which is illustrated as a block in FIG. 1. A detailed schematic of digital filter 24 is illustrated in FIG. 2. The output of digital filter 24 is applied to a line 26. As will be more fully described, the digital filter 24 operates to filter out noise induced voltage pulses that begin with a positive transition (zero level to one level). The filter also operates in such a manner that when the digital signal has been at a valid one level and then goes low the filter will process this falling edge immediately. When no noise induced transitions occur the falling edges or negative transitions of the square wave voltage on line 26 follows and is in phase with the falling edges of the input voltage on line 22.

The line 26 is connected to an ignition control circuit 28 which develops and controls the application of spark firing voltages to the spark plugs 30 of engine 10. The ignition control controls an inductive ignition system that has a plurality of ignition coils (not illustrated) that are connected to the spark plugs. The system is a known distributorless system wherein a secondary winding of an ignition coil is connected to two spark plugs which are fired in series. The falling edges or negative transitions of the square-wave voltage on line 26 are used to identify the correct ignition coil to be energized in order to correctly fire a given pair of spark plugs in synchronism with crankshaft position. Ignition control 28 is energized by a direct voltage source 32 of a motor vehicle which is illustrated as a battery. The battery is charged by a direct voltage charging system in a known manner. Direct voltage source 32 supplies the other electronic components of the system by connections which are not illustrated.

The square-wave output voltage on line 26 is applied to line 34 which is connected to one shot multivibrator 38 by line 36. The one-shot multivibrator 38 is connected to digital filter 24 by a line 39. This square-wave voltage is also applied to a Tach-Counter 40 by lines 34 and 37. The Tach-Counter 40 receives clock pulses from a clock pulse source 41 which may have a frequency of 31.25 KHz. The Tach-Counter 40 counts clock pulses for 60° intervals to provide a count that represents engine rpm or speed. The counter 40, together with suitable logic circuitry provides output signals on lines 42 and 43 that are a function of engine speed. The lines 42 and 43 are connected to the digital filter 24 and the logic state of lines 42 and 43, which is a function of engine speed, determines the magnitude of time periods that are used by the digital filter 24 in a manner that will be described.

FIG. 2 illustrates the digital filter 24, shown as a block in FIG. 1, and it will now be described. In FIG. 2, the same reference numerals have been used as were used in FIG. 1 to identify corresponding lines or conductors. In FIG. 2 the input line 22, which has the square-wave voltage 20 applied thereto, is connected to a one-shot multivibrator OS2 also identified as 44 by an inverter 45. The output of one-shot MV44 is connected to line 46. Line 22 is also connected as an input to one-shot multivibrator OS3 also identified as 47. The output of one-shot 47 is connected to line 48 which is connected to NOR gate 49 and to NOR gate 50 via line 51. The output of one-shot 44 on line 46 is connected to NOR gate 52, to NOR gate 50, to AND gate 53, to AND gate 56 and to NOR gate 57. NOR gate 52 and NOR gate 54 provide an RS latch since they are cross coupled. The same is true of NOR gates 49 and 55.

The outputs of AND gates 53 and 56 are connected as inputs to NOR gate 55.

The square-wave signal on line 22 is applied to the D input of a flip-flop 60. The QB output of flip-flop 60 is an input to AND gate 56. The CB input of flip-flop 60 is connected to the output of NOR gate 61 via line 62. The output of NOR gate 61 is also connected to an input of NOR gate 54 via lines 62 and 63.

The digital filter 24 has a three stage ripple counter that is comprised of flip-flops FF1, FF2 and FF3 which are connected together as shown in FIG. 2. The reset terminals R of these flip-flops are connected to line 66. The line 66 is connected to the output of NOR gate 50 via inverter 67.

The digital filter has a pair of logic control lines 68 and 70 that are connected to inputs of NOR gate 61. These lines are energized with five volts via field effect transistors 71 and 72. The line 68 is connected to four field effect transistors 73, 74, 75 and 76. Field effect transistor 73 is shown as having its gate connected to line 77 and its drain-source circuit connected between line 68 and ground. Accordingly, when FET 73 is biased conductive the line 68 is grounded or is placed at a low or zero logic level. The FETs 74, 75 and 76 are illustrated as circles have shaded and unshaded portions. These transistors have the same type of connection to line 68 as the connection of transistor 73 to line 68. The gates of transistors 74–76 are the shaded portions thereof and when any of these transistors are biased conductive line 68 is grounded.

The line 70 is likewise connected to field effect transistors 78, 79, 80 and 81 which have been illustrated as circles having shaded and unshaded portions. These FETs are connected to line 70 in the same manner as the connection of FET 73 to line 68, that is when a FET is biased conductive the line 70 is connected to ground or to a zero logic level. The shaded portion of FETs 78–81 are connected to the gates of these FETs.

The QB output of flip-flop FF1 is connected to the gate of FET 74. The Q output of flip-flop FF2 is connected to the gate of FET 75. The QB output of flip-flop FF3 is connected to the gate of FET 76.

The Q output of flip-flop FF1 is connected to the gate of FET 79 and the QB output of FF2 is connected to the gate of FET 80. The Q output of FF3 is connected to the gate of FET 81.

The digital filter has a pair of latching flip-flops FF4 and FF5. The D input of FF4 is connected to line 42 which in turn is connected to Tach-Counter 40. The Q output of FF4 is connected to the gate of FET 78 and the QB output of FF4 is connected to the gate of FET 73 via line 77. The gate terminal G of FF4 is connected to line 39.

The D input of FF5 is connected to line 43. The QB output of FF5 is connected as an input to NOR gate 61, to AND gate 53 and to an input of NOR gate 54 via line L1. The gate terminal G of FF5 is connected to line 39.

The clock 41 is connected as an input to NOR gate 82. The output of NOR gate 82 is connected to the input of NOR gate 83 through inverter 84. The inverter 84 is connected to line 85 which in turn is connected to the CB input of flip-flop FF6. The output of NOR gate 83 is connected to the CB input of flip-flop FF1.

One of the inputs to NOR gate 83 is connected to the output of NOR gate 86. One of the inputs to NOR gate 86 is the output of NOR gate 61 via line 62.

The digital filter has NOR gates 87 and 88 that form a reset-set latch. One of the inputs to gate 87 is the output of NOR gate 57. The output of NOR gate 87 is connected to line 26 and to the R input of FF6 via inverter 89 and line 90. One of the inputs to NOR gate 88 is connected to line 91. The line 91 is connected to line 92 by an inverter 93. The lines 90 and 92 are connected by inverters 93, 94 and 95. A capacitor 96 is connected between junction 97 and ground. The QB terminal of FF6 is connected to line 98.

The output of NOR gate 54 is connected to an input of NOR gate 57 via line 100.

OPERATION

The operation of the system of this invention will now be described. Assume now that engine speed is in a low speed range of, for example below 2000 rpm. Under this condition of operation the Tach Counter 40 causes the lines 42 and 43 to have such logic states that flip-flop FF4 is set to a state which causes FET 78 to be biased conductive and FET 73 nonconductive. With transistor 78 biased conductive it grounds control line 70 so that control line 70 is held continuously at a low logic level as long as engine speed is below 2000 rpm. By holding line 70 low the line 70 is disabled from controlling or having any effect on the system.

The three stage ripple counter comprised of FF1, FF2 and FF3 counts clock pulses from clock 41 which are supplied to FF1 via NOR gate 83. This ripple counter is reset to a zero count level via NOR gate 50 and line 66 each time that a negative transition 20A or a positive transition 20B of signal 20 occurs and then starts counting up from zero after being reset. The ripple counter will hold a preset count magnitude once this preset magnitude is attained due to NOR gate 61, line 62, NOR gate 86 and NOR gate 83. Thus, when the ripple counter reaches a preset count value counting is terminated and the present count value is held until the counter is reset.

Figure 3:
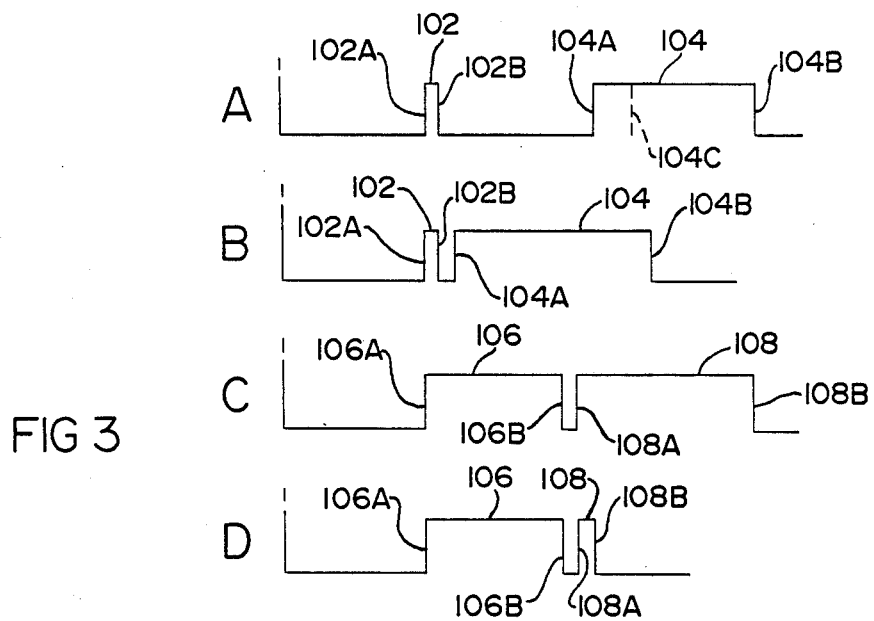
FIG. 3 illustrates waveforms that are useful in understanding this invention.

Assuming now that engine speed is still in the low speed range, let it be assumed the signal 20 takes the form shown in FIG. 3A. In FIG. 3A a positive unwanted noise pulse 102 has been developed due to noise. The pulse 102 has a rising edge 102A and a falling edge 102B. Also illustrated is square-wave pulse 104 having a rising edge 104A and a falling edge 104B. The digital filter will ignore pulse 102 or filter it out as will now be explained. The control algorithm of the digital filter is such that a one level occurring after a valid zero state has been recognized must remain at a one level for a predetermined length of time before it is considered a valid one state, otherwise it is completely ignored. In the case of pulse 102 of FIG. 3A the pulse 102 is ignored or in other words does not appear at output line 26 because it has not been maintained at the high or one level for the predetermined length of time. When transistion 102A occurs the ripple counter is reset to zero count and begins to count clock pulses and when transition 102B occurs the ripple counter terminates counting and the counter is again reset to zero count and starts to count up again. As the ripple counter counts up it will cause FETs 74, 75 and 76 to be biased from a conductive to a nonconductive state, depending upon how many counts have been counted. When the counter attains a certain preset count level or magnitude that corresponds to a predetermined time period the logic states of the signals applied to the gates of FETs 74, 75 and 76 will cause all of these FETs to be biased nonconductive. When FETs 74, 75 and 76 are all biased nonconductive the line 68 goes from a zero or low logic level to a one or high level. The time required for the ripple counter to count up from zero count to a count value that ultimately causes FETs 74, 75 and 76 to all be biased nonconductive corresponds to a predetermined time period. This predetermined time period for the low engine speed range (below 2000 rpm) may be about 119 to 171 microseconds which corresponds to about five clock pulses. Based on the foregoing the pulse 102 (FIG. 3A) would have to be high for the predetermined time period before it would be recognized. In this case it is assumed that pulse 102 has not been high for the predetermined time period and it accordingly is ignored and does not appear on output line 26. Thus, when transition 102B occurred to terminate counting by the ripple counter the counter had not attained a count magnitude that was high enough to cause FETs 74, 75 and 76 to be all biased nonconductive and accordingly line 68 did not go from a low state to a high state during the time that pulse 102 of waveform 20 is in a high state.

It should be noted that all three inputs to NOR gate 61 are low when the ripple counter starts counting up and its output is now high. When the counter attains its preset count value, that is a count value which corresponds to the predetermined time period of 119 to 171 microseconds, the output of NOR gate 61 develops a high to low transition. This transition is applied to the CB input of flip-flop 60 via line 62 which clocks the flip-flop 60. This has the effect of latching in the value of the square wave signal on input line 22 which is connected to the D input of flip-flop 60. This latched level is held until another time-out of the counter occurs, that is when the counter attains its preset count value.

Referring again to FIG. 3A, it is assumed that the time period between transitions 102B and 104A is longer than the predetermined time period of about 119 to 171 microseconds. Further, it is assumed that the period of time that pulse 104 is high is longer than the predetermined time period. The digital filter will pass or process pulse 104. Thus, transition 104B will not occur until after the ripple counter has counted up to a preset count value that will cause FETs 74, 75 and 76 to be all biased nonconductive. In this regard it should be noted that at transition 104A the counter is reset and starts counting up. It is assumed that the counter attains its preset count value at a time point represented by dotted line 104C whereupon the preset count value is held in the counter and counting is terminated. Under this condition of operation the preset count value is held and line 68 is held at a one level until the counter is reset. Time point 104C occurs at the same time that line 68 goes high causing a low to high transition of the voltage on output line 26 that is in phase with time point 104C. The output voltage transition on line 26 which occurs at time point 104C will be delayed from edge 104A by the predetermined time period. However, an output transition will occur on line 26 at the same time as transition 104B so that the falling edge of the output signal will occur when 104B occurs. Thus, although the rising edge of the output signal is delayed from the rising edge of the input signal the falling edge of the output signal occurs at the same time as the falling edge of the input signal. Since the system responds to falling edges of the output signal the fact that output rising edge was delayed from the input rising edge does not introduce error into the system.

Referring now to FIG. 3B, a case is illustrated where the noise induced pulse 102 has occurred just prior to pulse 104. In this case pulse 102 will not be processed because its high time is less than the predetermined time period but pulse 104 will be processed even though the time period between edges 102B and 104A is less than the predetermined time period. In this regard it is noted that prior to the occurrence of edge 102A the filter has recognized a valid zero level, that is the signal has been low for a time that is longer than the predetermined time period. When this occurs it is used to set flip-flop 60 to QB=1 or in other words, stores away the fact that a valid zero level is found. When pulse 102 occurs it is too narrow and does not get recognized. This does not change the state of flip-flop 60. Therefore, the circuit remembers that it has a valid zero level before the positive noise occurred and it does not have to see another valid zero level after the positive noise pulses because flip-flop 60 remembers that it had seen a valid zero level.

Referring now to FIG. 3C, a case is illustrated in which a negative transition has occurred that was caused by noise. In FIG. 3C, pulse 106 has a rising edge 106A and a falling edge 106B. Pulse 108 has a rising edge 108A and a falling edge 108B. It is assumed that the falling edge 106B was caused by noise. It is further assumed that the time period between edges 106A and 106B was longer than the predetermined time period. Based on these assumptions the falling edge 106B will be processed. However, pulse 108 will be ignored because the time period between edges 106B and 108A was less than the predetermined time period. Putting it another way, there was not a valid zero state that preceded transition 108A. Further, it is pointed out that pulse 106 is recognized as a valid one. In view of this a QB=0 is stored on flip-flop 60 so the circuit remembers that a valid one state has occurred. Between 106B to 108A the low state is too short and accordingly is not recognized as a valid zero state. This will therefore keep flip-flop 60 set to QB=0 so the circuit knows that it has processed a valid one. Therefore, pulse 108 will be completely ignored because the circuit realizes this should be a part of pulse 106.

In FIG. 3D pulses 106 and 108 are illustrated. In this case pulse 108 is shown as having a smaller high time as compared to pulse 108 of FIG. 3C. In the case of the FIG. 3D waveform, the falling edge 106B will be processed because the time period between edges 106A and 106B exceeds the predetermined time period. Pulse 108 will not be processed because the time period between edges 106B and 108A (low time) did not exceed the predetermined time period.

SUMMARY OF OPERATION

The following is a summary of the operation of the digital filter.

(1) The ripple counter is reset to a zero count level and then starts to count up when reset at each positive or negative transition of square-wave 20. If the time period between a pair of transitions exceeds the predetermined time period that corresponds to a preset count value that is attained by the counter the counter holds this count value and also causes a control line, such as line 68, to shift its logic level. The counter now holds the preset count and maintains the logic level on line 68 until it is reset by a subsequently occurring voltage transition on line 22.

(2) The filter determines whether the low and high states of the digital square wave respectively exceed or do not exceed the predetermined time period.

(3) If the low and high states do exceed the predetermined time period the input signal is passed to the output provided that a valid opposite state was recognized and stored in flip-flop 60 prior to the start of this predetermined time.

(4) If a pulse occurs wherein the high state of the pulse has not been maintained in this state for the predetermined time period the pulse is ignored.

As previously pointed out, the predetermined time period for the low speed range is about 119 to 171 microseconds. By comparison, the time period between consecutive falling edges 20A of square wave 20 at 2000 rpm may be about five milliseconds. At this speed the high time periods of the square wave 20 may be about 500 microseconds. It accordingly can be seen that the digital filter may operate many times over a given 60 degrees of rotation of disk 12. Further, at any speed of the engine the high times of signal 20 (20B to 20A) will always be longer than the predetermined time period.

Between engine speeds of about 2000 rpm to 4000 rpm the digital filter is gated to a condition wherein the predetermined time period is reduced from the 119 to 171 microsecond range to a range of about 29 to 69 microseconds. The 29 to 69 microsecond range corresponds to about two clock pulses. This occurs in response to the logic levels applied to lines 42 and 43 from Tach-Counter 40. Between 2000 and 4000 rpm FF4 causes FET 73 to be biased conductive thereby grounding control line 68 and accordingly disabling line 68 as a control. FET 78 is now biased nonconductive to enable line 70. As the ripple counter (FF1, FF2, FF3) counts clock pulses it causes FETs 79, 80 and 81 to be all biased nonconductive when the count of the counter has attained a certain preset value that corresponds to the predetermined time period of 29 to 69 microseconds. When FETs 79, 80 and 81 have all been biased from a conductive to a nonconductive state the line 70 goes from a low state to a high state. The filter operates in the same manner as has been described with engine speed below 2000 rpm with the exception that the predetermined time period has been reduced.

At the expense of some reiteration it will be appreciated that the digital filter determines whether or not the high or low time periods of square wave 20 exceed a predetermined time period and then processes this signal to the output in accordance with the determination that was made.

Above engine speeds of 4000 rpm the predetermined time period is set to zero so that no filtering occurs. Thus, at speeds above 4000 rpm FF5 applies its QB output to NOR gate 61 which forces the output of NOR gate 61 to a zero state. The output signal now exactly follows the input signal without any filter action or processing.

Some of the ancillary features of the FIG. 2 circuit will now be described. Input lines 110 and 112 are connected to the AND gate 114. The output of AND gate 114 is connected as input to NOR gate 82. Line 110 is adapted to be connected to a clock pulse source during testing of the FIG. 2 circuit. During this testing a signal is applied to line 112 to cause AND gate 114 to pass the clock signal.

The line 116 is a power on reset input line. When a signal is applied to line 116 various logic elements connected to this line are reset to an initial logic state. The signal can be applied to line 116 when the ignition switch of a motor vehicle system is closed to start the engine.

The output line 98 provides a square wave signal that is synchronized to the signal on line 90 and to an edge of the clock signal. The signal on line 98 may thus be termed a synchronous signal whereas the output signal on line 26 is an asynchronous signal.

It should be noted that one of the important advantages of this invention is that the filter guarantees that there will be only one output signal for each input signal. Thus, during one revolution of disk 12 only six pulses will be produced at the output of the filter. There may be some slight position error when a negative transition like 106B occurs but the system will still operate to provide only one output pulse for one input pulse.

The system could be arranged such that more than two speed ranges and more than two corresponding predetermined time periods be used.

The embodiments of the invention in which an exclusive property or privilege is claimed are defined as follows:

1. A digital system for providing a series of voltage pulses that occur at predetermined angular positions of the crankshaft of an internal combustion engine comprising, an engine having a crankshaft, sensor means including means driven by said crankshaft for developing a square wave signal that has a plurality of high level voltage pulses that occur at predetermined angular positions of the crankshaft separated by low level periods, the spacing between corresponding edges of said pulses corresponding to a predetermined amount of angular rotation of said crankshaft, said high level voltage pulses and said low level periods lasting for predetermined time periods that vary with variation in engine speed, digital filter means having an input and an output, said input of said digital filter means coupled to said sensor means, said digital filter means comprising means for determining whether or not the time periods of said high level pulses or said low level periods exceed predetermined time periods, means coupled to said determining means for preventing a high level voltage pulse of said square wave signal from being passed to said output when said high level voltage pulse has a time period that was determined to be less than said predetermined time period, and means coupled to said determining means for passing a high to low level transition of said square wave to said output when just prior to said transition said square wave had a high level period that was longer than said predetermined time period.

2. The digital system according to claim 1 wherein means are provided for sensing engine speed and for varying said predetermined time periods as a function of engine speed.

3. The digital system according to claim 1 wherein means are provided for disabling said digital filter means at engine speeds above a predetermined engine speed.

4. A digital system for providing a series of voltage pulses that occur at predetermined angular positions of the crankshaft of an internal combustion engine comprising, an engine having a crankshaft, sensor means including means driven by said crankshaft for developing a square wave signal that has a plurality of high level pulses that occur at predetermined angular positions of the crankshaft separated by low level periods, said high level pulses and said low level periods lasting for predetermined time periods that vary with variation in engine speed, digital filter means having an output and an input, said input of said digital filter means coupled to said sensor means to receive said square wave signal, said filter means comprising means for determining whether or not a high level pulse has been maintained at said high level for longer than a predetermined time period, and means coupled to said determining means for passing a high to low level transition of said square wave to said output when just prior to said transition said square wave has a high level period that was longer than said predetermined time period.

5. The digital system according to claim 4 wherein means are provided for sensing engine speed and for varying said predetermined time period as a function of engine speed.

6. The digital system according to claim 4 wherein means are provided for disabling said digital filter means at engine speeds above a predetermined engine speed.

* * * * *